(12) United States Patent
Imai et al.

(10) Patent No.: US 6,969,907 B2
(45) Date of Patent: Nov. 29, 2005

(54) COOLING STRUCTURE FOR MULTICHIP MODULE

(75) Inventors: Makoto Imai, Toyota (JP); Naoki Ogawa, Toyota (JP); Yuji Yagi, Aichi (JP); Takashi Kojima, Aichi (JP); Yasushi Yamada, Aichi (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 10/262,865

(22) Filed: Oct. 3, 2002

(65) Prior Publication Data

US 2003/0025197 A1 Feb. 6, 2003

Related U.S. Application Data

(63) Continuation of application No. 09/747,517, filed on Dec. 21, 2000, now abandoned.

(30) Foreign Application Priority Data

Dec. 21, 1999 (JP) ............................................. 11-362058
Nov. 10, 2000 (JP) ........................................ 2000-343677

(51) Int. Cl.[7] ........................ H01L 23/34; H01L 23/02; H01L 23/28; H01L 23/38; H01L 23/40

(52) U.S. Cl. ........................ 257/713; 257/685; 257/706; 257/712; 257/717; 257/720; 257/723; 257/796; 257/930; 257/E23.08; 257/E23.081; 257/E23.082; 257/E23.101; 257/E23.102; 257/E23.083

(58) Field of Search ................................. 257/712–713, 257/723, 685, 706, 717, 720, 796, 930, E23.08, E23.081, E23.082, E23.083, E23.101, E23.102

(56) References Cited

U.S. PATENT DOCUMENTS

| | | | | |
|---|---|---|---|---|
| 4,558,395 A | * | 12/1985 | Yamada et al. | 361/699 |
| 5,021,924 A | * | 6/1991 | Kieda et al. | 361/699 |
| 5,239,448 A | * | 8/1993 | Perkins et al. | 361/764 |
| 5,323,292 A | * | 6/1994 | Brzezinski | 361/689 |
| 5,345,107 A | * | 9/1994 | Daikoku et al. | 257/717 |
| 5,480,840 A | * | 1/1996 | Barnes et al. | 438/107 |
| 5,500,555 A | * | 3/1996 | Ley | 257/700 |
| 5,751,062 A | * | 5/1998 | Daikoku et al. | 257/722 |

(Continued)

FOREIGN PATENT DOCUMENTS

| | | |
|---|---|---|
| EP | 0 361 495 | 4/1990 |
| EP | 0 376 478 A | 7/1990 |
| FR | 2 2665 046 | 1/1992 |
| JP | 08-195455 | 7/1996 |
| JP | 11 121666 A | 4/1999 |
| JP | 11-121666 | 4/1999 |
| WO | WO 98 12748 A | 3/1998 |

*Primary Examiner*—Amir Zarabian
*Assistant Examiner*—Ida M. Soward
(74) *Attorney, Agent, or Firm*—Kenyon & Kenyon

(57) ABSTRACT

A first electronic device, a second electronic device which generates less heat than the first electric device, and an electrode are connected by a heat leveling plate formed of an electrically conductive material having high thermal conductivity. A heat radiation plate is provided below an insulated substrate to which the first and second electronic devices are mounted. The second electronic device is cooled by a heat radiation path which extends through the insulated substrate and the heat radiation plate and a heat radiation path which extends through the second electronic device and the electrode to the heat radiation plate. The first and the second electronic device have substantially the same temperature due to heat radiation through the heat leveling plate. As a result, cooling effect of the electronic devices can be enhanced.

19 Claims, 5 Drawing Sheets

U.S. PATENT DOCUMENTS

| | | | | |
|---|---|---|---|---|
| 5,844,311 | A | * | 12/1998 | Watanabe et al. ............ 257/712 |
| 5,859,763 | A | * | 1/1999 | Nam et al. .................. 361/699 |
| 5,930,135 | A | * | 7/1999 | Janko ......................... 363/144 |
| 5,959,352 | A | * | 9/1999 | Topfer et al. ................ 257/717 |
| 6,046,410 | A | * | 4/2000 | Wojnarowski et al. ...... 174/262 |
| 6,046,498 | A | * | 4/2000 | Yoshikawa .................. 257/706 |
| 6,138,348 | A | * | 10/2000 | Kulesza et al. ............... 29/840 |
| 6,144,013 | A | * | 11/2000 | Chu et al. ................... 219/209 |
| 6,366,461 | B1 | * | 4/2002 | Pautsch et al. .............. 361/690 |
| 6,393,169 | B1 | * | 5/2002 | Paniccia et al. ............... 385/14 |
| 6,469,895 | B1 | * | 10/2002 | Smith et al. ................. 361/704 |
| 6,642,064 | B1 | * | 11/2003 | Terrill et al. ................... 438/15 |
| 2001/0001989 | A1 | * | 5/2001 | Smith ........................ 174/52.1 |
| 2002/0000239 | A1 | * | 1/2002 | Sachdev et al. ................ 134/2 |
| 2002/0003232 | A1 | * | 1/2002 | Ahn et al. ..................... 257/81 |

* cited by examiner

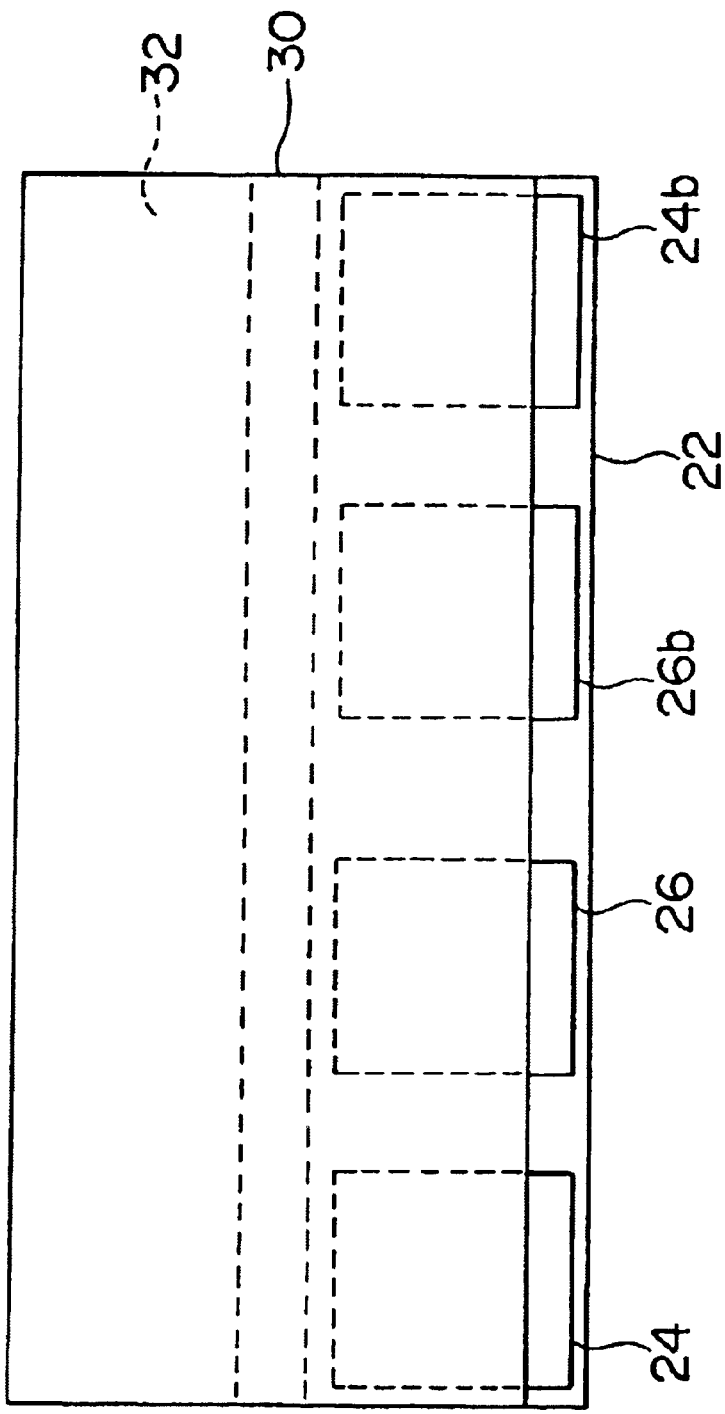

COOLING STRUCTURE FOR MULTICHIP MODULE

CROSS REFERENCE TO RELATED APPLICATIONS

This application is a Continuation of application Ser. No. 09/747,517, filed Dec. 21, 2000 now abandoned, which is included herein in its entirety by reference.

INCORPORATION BY REFERENCE

The disclosures of Japanese Patent Application Nos. HEI 11-362058 filed on Dec. 21, 1999, and 2000-343677 filed on Nov. 10, 2000, including the specifications, drawings and abstracts are incorporated herein by reference in their entirety.

BACKGROUND OF THE INVENTION

1. Field of the Invention

The invention relates to a cooling structure for a multichip module and, more particularly, to a cooling structure for a multichip module having a plurality of electronic devices that generate different amounts of heat relative to each other.

2. Description of Related Art

In general, as a cooling structure for a multichip module, there is proposed a structure for cooling a multichip module by radiating heat from one face thereof (e.g. Japanese Patent Application Laid-Open No. HEI 11-121666). In this structure, a heat radiation body for covering a plurality of electronic devices is attached to a substrate to which the electronic devices that are different in height are mounted, with a silicon seat of high thermal conductivity being interposed among the electronic devices. Heat generated from the respective electronic devices is radiated through the heat radiation body.

The electronic devices, which are used to control electric power or the like, need to be kept below a permissible operating temperature and therefore heat generated in connection with switching operation or the like needs to be removed. Thus, it is considered important to achieve improvement of performance and size reduction in the cooling structure.

SUMMARY OF THE INVENTION

It is an object of the invention to provide a cooling structure for a multichip module which is small in size and which demonstrates excellent cooling performance.

In order to achieve the above-stated object, according to an aspect of the invention, there is provided a cooling structure for a multichip module having a plurality of electronic devices, in which the devices generate different amount of heat relative to each other, comprising a first member which is provided on a first face of the multichip module and which transmits heat generated by the electronic devices to the outside of the module and a second member which is provided on a second face that is different from the first face, which is in contact with the electronic devices, and which has thermal conductivity.

According to the aforementioned aspect, part of the heat generated from a first electronic device which generates much heat is transmitted to a second electronic device by the second member. Thus, the electronic devices become uniform in temperature, whereby it becomes easier for the first member to transmit heat to the outside of the module. Consequently, a structure which is small in size and which provides excellent cooling effect can be obtained.

In the aforementioned aspect, electric power may be supplied to the electronic devices through the second member. This makes it possible to economize space for the member for supplying electric power and thus to achieve further size reduction.

BRIEF DESCRIPTION OF THE DRAWINGS

The foregoing and further objects, features and advantages of the invention will become apparent from the following description of a preferred embodiment with reference to the accompanying drawings, wherein:

FIG. 6 is a plan view of the multichip module 20b show in FIG. 5 as viewed in a direction indicated by an arrow A.

DETAILED DESCRIPTION OF PREFERRED EMBODIMENT

Figure 1:
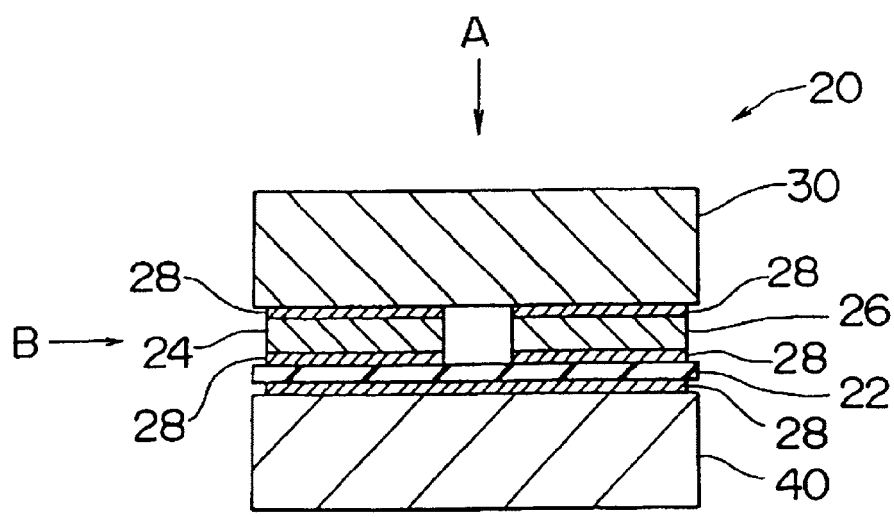
FIG. 1 is a front view of the construction of a multichip module having a cooling structure according to one embodiment of the invention.
Figure 2:
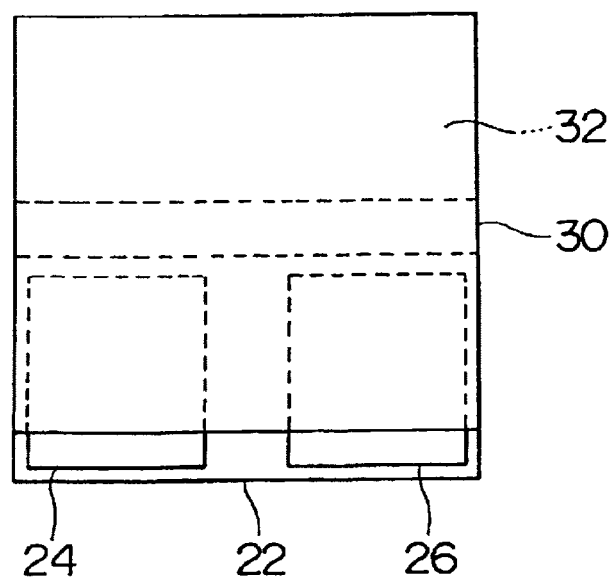
FIG. 2 is a plan view of the multichip module shown in FIG. 1 as viewed in a direction indicated by an arrow A.
Figure 3:
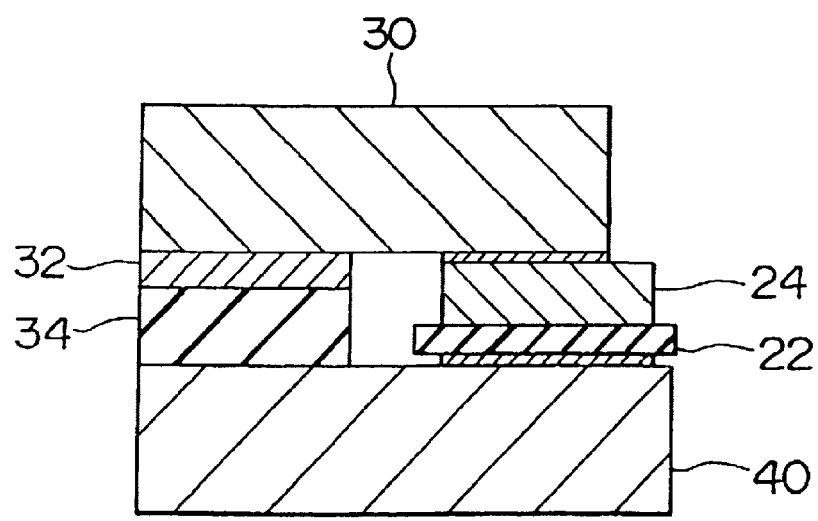
FIG. 3 is a plan view of the multichip module 20 shown in FIG. 1 as viewed in a direction indicated by an arrow B.

An embodiment of the invention will be described with reference to the drawings. FIG. 1 is a front view of the overall construction of a multichip module 20 having a cooling structure of the invention. FIG. 2 is a plan view of the multichip module 20 shown in FIG. 1 as viewed in a direction indicated by an arrow A. FIG. 3 is a plan view of the multichip module 20 shown in FIG. 1 as viewed in a direction indicated by an arrow B.

As shown in FIGS. 1 through 3, the multichip module has electronic devices 24, 26. The electronic devices 24, 26 generated different amounts of heat. The electronic devices 24, 26 are mounted to an insulate substrate 22 by means of solder 28. It is assumed herein that the generation of heat by the electronic device 24 is greater than that by the electronic device 26. The module 20 has an electrode 32 for supplying electric power to the electronic devices 24, 26, a heat leveling plate 30 that makes the electronic devices 24, 26 substantially uniform in temperature, and a heat radiation plate 40 disposed below the insulated substrate 22. Also, an insulator 34 with high the al conductivity is provided between the electrode 32 and the heat radiation plate 40.

In general, heat generated by electronic devices is varied depending on drive conditions. While the electronic device 24 includes an IGBT, a power MOS and a power transistor, the electronic device 26 includes a diode, for example.

The heat leveling plate 30 makes the temperatures of electronic devices 24, 26 substantially uniform and also supplies them with electric power from the electrode 32. Thus, an electrically conductive material of high thermal conductivity is used as a base material of the heat leveling plate 30. For example, it is possible to use aluminum, copper, molybdenum and the like.

The heat radiation plate 40 radiates heat to a cooling medium such as air and water and is thus made from a material of high thermal conductivity (e.g. a metal such as aluminum and stainless steel).

The heat radiation plate 40 may include a flow passage for the cooling medium or form a flow passage for the cooling medium in combination with another member. Fins may be provided in a portion facing the flow passage for the cooling medium to enhance cooling effect.

Next, heat radiation paths of the multichip module constructed as described above will be described. The heat radiation paths of the multichip module 20 of the embodiment include a first path wherein heat generated from the electronic devices 24, 26 flows from the heat radiation plate 40 to the cooling medium through the insulated substrate 22, a second path wherein heat generated from the electronic device 24 flows to the cooling medium through the heat leveling plate 30, the electronic device 26, the insulated substrate 22 and the heat radiation plate 40, and a third path wherein heat generated from the electronic device 24 flows to the cooling medium through the heat leveling plate 30, the electrode 32, the insulator 34 and the heat radiation plate 40. The second and third paths both include the heat leveling plate 30. That is, the heat leveling plate 30 distributes heat generated from the electronic device 24 to the electronic device 26 and the electrode 32. Accordingly, the electronic devices 24, 26 and the electrode 32 become substantially uniform in temperature. As a result, in comparison with a cooling structure provided only with the first path wherein heat generated from the electronic device 24 flows from the heat radiation plate 40 to the cooling medium through the insulated substrate 22, cooling effect of the electronic device 24 can be enhanced.

In this case, the electronic device 26 which generates less heat than the electronic device 24 is supplied with heat from the electronic device 24 by the heat leveling plate 30. Thus, the temperature of electronic device 26 becomes higher than a temperature attained by heat generation of the electronic device 26 itself. However, the permissible operating temperature of a general semiconductor device is substantially constant (e.g. approximately 150° C.) regardless of its generation of heat. Thus, as long as the temperature of the electronic device 24 is lower than the permissible operating temperature (as long as the electronic device 24 is in normal operation), the temperature of the electronic device 26 does not exceed the permissible operating temperature even if it has received heat generated by the electronic device 24 through the heat leveling plate 30.

According to the multichip module 20 described hitherto, the heat leveling plate 30 is used to make the electronic devices 24, 26 and the electrode 32 substantially uniform in temperature. Thereby it becomes possible to enhance cooling effect of the electronic device 24 in comparison with a cooling structure which does not have the heat leveling plate 30, and to reduce the size of the entire module. In addition, since the heat leveling plate 30 also serves as a member for supplying electric power to the electronic devices 24, 26 from the electrode 32, additional wire bonding does not need for supplying electric power to the electronic devices 24, 26 from the electrode. Consequently, the multichip module 20 can also be applied to small-size electronic devices which do not permit wire bonding. Also, it is possible to prevent complication of the multichip module.

It is preferable to maintain coefficient of thermal expansion of the heat leveling plate 30 and the heat radiation plate 40 in a permissible range at a steady driving state to prevent warp of the multichip module 20.

Figure 4:
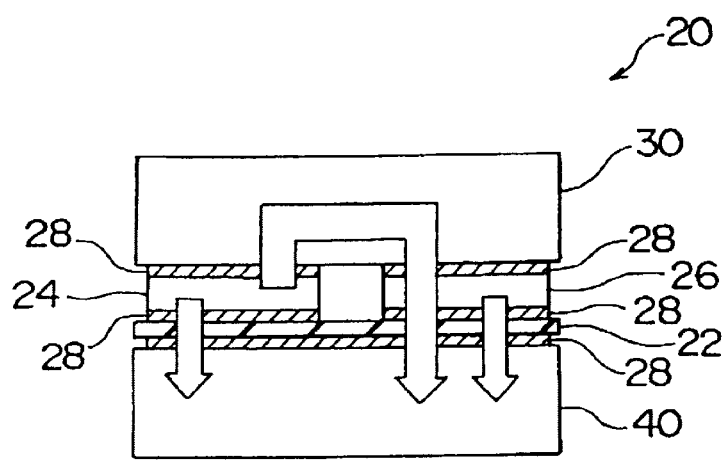
FIG. 4 is a explanatory drawing of a heat radiation path of multichip module 20 shown in FIG. 1.

As shown in FIG. 4, heat generated by the electronic devices 24, 26 passes through the multichip module 20 along respective paths as indicated by arrows, and the heat is radiated from the heat radiation plate 40 to the outside. Accordingly, it may be difficult to level the temperature of the heat leveling plate 30 and the temperature of the heat radiation plate 40 to be substantially equal to each other. The heat radiation plate 40 having substantially the same coefficient of thermal expansion as that of the heat leveling plate 30 can prevent warp of the multichip module 20, even if there is a temperature gap between the heat leveling plate 30 and the heat radiation plate 40. It is possible to form the insulated substrate 22, instead of the heat radiation plate 40, of a material having substantially the same coefficient of thermal expansion as that of the heat leveling plate 30. It is also possible to add another member to the structure, which has the substantially the same thermal expansion as the heat leveling plate 30.

A body of the heat leveling plate 30 may be formed of a material which has thermal conductivity but which does not have electrical conductivity, for example, a ceramic material such as aluminum nitride and alumina. On a face of the heat leveling plate 30 which is in contact with the electronic devices 24, 26, a wiring pattern capable of supplying electric power from the electrode 32 may be formed of a material which has electrical conductivity.

In the multichip module 20 of the aforementioned embodiment, a member for supplying electric power to the electronic devices 24, 26 may be provided separately from the heat leveling plate 30.

In the multichip module 20 of the aforementioned embodiment, the electronic devices 24, 26 are sandwiched between the heat leveling plate 30 and the heat radiation plate 40. The heat leveling plate 30 is provided so as to advance uniformity of temperature among the electronic devices 24, 26 and the electrode 32. Therefore, the electronic devices 24, 26 may be mounted to a face of the heat leveling plate 30 which does not face the heat radiation plate 40, for example, to a lateral face or a front face of the heat leveling plate 30.

Figure 5:
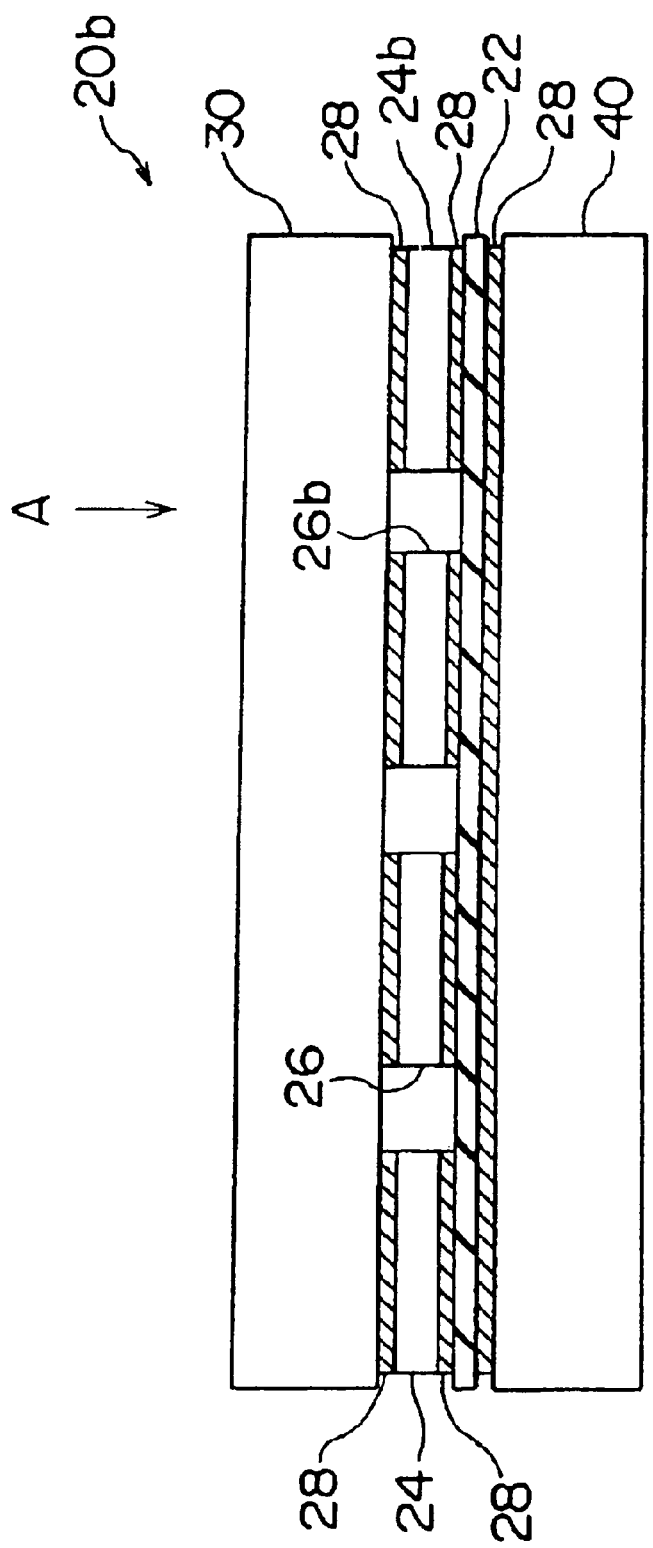
FIG. 5 is a front view of the construction of a multichip module 20b having four electronic devices.

The invention may be applied to a multichip module having three or more electronic devices. For example, heat generated in a multichip module 20b having four electronic devices 24, 24b, 26, 26b, as shown in FIGS. 5 and 6, can be released in the same manner as described above.

Although the embodiment of the invention has been described hitherto, the invention is not limited thereto. It goes without saying that the invention can be implemented in various forms as long as they do not depart from the spirit and scope of the invention.

What is claimed is:

1. A cooling structure for a multichip module having a plurality of electronic devices which generate different amounts of heat relative to each other, the cooling structure comprising:
   a first member which forms a first face of the multichip module and which transmits heat generated by the electronic devices to the outside of the module; and
   a second member which forms a second face of the multichip module that is different from the first face, which is in contact with the electronic devices and which does not contact the first member, and which has thermal conductivity,
   wherein the plurality of electronic devices includes at least one low heat device comprising a diode and at least one high heat device selected from the group consisting of an insulated gate bipolar transistor, a metal-oxide semiconductor and a power transistor, and
   heat generated from the high heat device flows to the first member through the low heat device and the second member.

2. A cooling structure according to claim 1, wherein the first member transmits heat generated by the electronic devices to a cooling medium.

3. A cooling structure according to claim 2, wherein the cooling medium includes air and water.

4. A cooling structure according to claim 1, wherein the second member has electrical conductivity and is electrically in contact with the electronic devices.

5. A cooling structure according to claim 2, wherein the second member comprises an insulating member and a wiring pattern which is electrically in contact with the electronic devices.

6. A cooling structure according to claim 1, further comprising a third member that supports the electronic devices, wherein a coefficient of thermal expansion of the second member and that of the third member are in a predetermined range at steady driving state of the multichip module.

7. A cooling structure according to claim 6, wherein the coefficient of thermal expansion of the second member is substantially the same as that of the third member.

8. A cooling structure according to claim 6, wherein the third member is a substrate on which the electric devices are arranged.

9. A cooling structure according to claim 1, wherein a coefficient of thermal expansion of the first member and that of the second member are in a predetermined range at steady driving state of the multichip module.

10. A cooling structure according to claim 4, further comprising a third member that supports the electronic devices, wherein a coefficient of thermal expansion of the second member and that of the third member are in a predetermined range at steady driving state of the multichip module.

11. A cooling structure according to claim 10, wherein the coefficient of thermal expansion of the second member is substantially the same as that of the third member.

12. A cooling structure according to claim 10, wherein the third member is a substrate on which the electric devices are arranged.

13. A cooling structure according to claim 4, wherein a coefficient of thermal expansion of the first member and that of the second member are in a predetermined range at steady driving state of e multichip module.

14. A cooling structure according to claim 13, further comprising a third member that supports the electronic devices, wherein a coefficient of thermal expansion of the second member and that of the third member are in a predetermined range at steady driving state of the multichip module.

15. A cooling structure according to claim 12, wherein the coefficient of thermal expansion of the second member is substantially the same as that of the third member.

16. A cooling structure according to claim 1, wherein the first and second members are so located to sandwich the electronic devices.

17. A cooling structure according to claim 2, wherein the second member has electrical conductivity and is electrically in contact with the electronic devices.

18. A cooling structure according to claim 2, wherein the second member comprises an insulating member and a wiring pattern which is electrically in contact with the electronic devices.

19. A cooling structure according to claim 14, wherein the third member is a substrate on which the electrical devices are arranged.

* * * * *

UNITED STATES PATENT AND TRADEMARK OFFICE
CERTIFICATE OF CORRECTION

PATENT NO. : 6,969,907 B2
APPLICATION NO. : 10/262865
DATED : November 29, 2005
INVENTOR(S) : Imai et al.

It is certified that error appears in the above-identified patent and that said Letters Patent is hereby corrected as shown below:

| Column | Line | |
|---|---|---|
| 2 | 48 | Change "the al" to --thermal--. |
| 6 | 10 | Change "of e" to --of the--. |

Signed and Sealed this

Nineteenth Day of September, 2006

JON W. DUDAS
*Director of the United States Patent and Trademark Office*